US009853661B2

(12) United States Patent
Tate et al.

(10) Patent No.: US 9,853,661 B2
(45) Date of Patent: Dec. 26, 2017

(54) ON-THE-FLY EVALUATION OF THE NUMBER OF ERRORS CORRECTED IN ITERATIVE ECC DECODING

(71) Applicant: Apple Inc., Cupertino, CA (US)

(72) Inventors: Yonathan Tate, Kfar Saba (IL); Asaf Landau, Modiin (IL); Micha Anholt, Tel Aviv (IL)

(73) Assignee: APPLE INC., Cupertino, CA (US)

( * ) Notice: Subject to any disclaimer, the term of this patent is extended or adjusted under 35 U.S.C. 154(b) by 0 days.

(21) Appl. No.: 14/961,913

(22) Filed: Dec. 8, 2015

(65) Prior Publication Data

US 2017/0163288 A1 Jun. 8, 2017

(51) Int. Cl.

*H04L 1/00* (2006.01)
*H03M 13/11* (2006.01)
*G06F 11/07* (2006.01)

(52) U.S. Cl.

CPC ....... *H03M 13/1131* (2013.01); *G06F 11/076* (2013.01); *G06F 11/0727* (2013.01); *H03M 13/116* (2013.01)

(58) Field of Classification Search

CPC ..................................................... H04L 1/0057
USPC ................................ 714/776, 773, 763, 752
See application file for complete search history.

(56) References Cited

U.S. PATENT DOCUMENTS 8,429,468 B2 * 4/2013 d'Abreu .............. G06F 11/1072 714/706
9,184,767 B2 * 11/2015 Vernon .............. H03M 13/1108
2014/0164867 A1 * 6/2014 Kaynak .................. G06F 11/10 714/763
2014/0281823 A1 * 9/2014 Micheloni ........... G06F 11/1012 714/773
2015/0349807 A1 * 12/2015 Vernon ............. H03M 13/1108 714/774

* cited by examiner

*Primary Examiner* — Fritz Alphonse
(74) *Attorney, Agent, or Firm* — D. Kligler IP Services Ltd.

(57) ABSTRACT

A decoder includes an interface and circuitry. The interface is configured to receive a code word that was encoded using a Quasi-Cyclic Low Density Parity Check (QC-LDPC) Error Correcting Code (ECC) represented by multiple check equations that are defined over multiple variables. The circuitry is configured to decode the code word by iteratively processing multiple layers that each includes a respective subset of the variables of the code word, and producing per each layer one or more count updates, and to generate a total number of errors corrected over the entire code word by accumulating the count updates.

16 Claims, 4 Drawing Sheets

ON-THE-FLY EVALUATION OF THE NUMBER OF ERRORS CORRECTED IN ITERATIVE ECC DECODING

TECHNICAL FIELD

Embodiments described herein relate generally to Error Correction Coding (ECC), and particularly to methods and systems for evaluating the number of errors corrected in iterative ECC decoding.

BACKGROUND

In various fields, such as data communications and data storage, the data is protected by applying Error Correction Coding (ECC). ECC typically involves calculating redundancy or parity bits that can be used for detecting and correcting corrupted data. Some types of error correction codes, such as Low-Density Parity-Check (LDPC) and Quasi-Cyclic LDPC (QC-LDPC) codes can be decoded using an iterative decoding process. Some applications that use ECC require knowledge of the number of error corrected during decoding for various purposes.

SUMMARY

Embodiments described herein provide a decoder, including an interface and circuitry. The interface is configured to receive a code word that was encoded using a Quasi-Cyclic Low Density Parity Check (QC-LDPC) Error Correcting Code (ECC) represented by multiple check equations that are defined over multiple variables. The circuitry is configured to decode the code word by iteratively processing multiple layers that each includes a respective subset of the variables of the code word, and producing per each layer one or more count updates, and to generate a total number of errors corrected over the entire code word by accumulating the count updates.

In some embodiments, the circuitry is configured to process each of the layers by processing the variables of the layer with respect to one or more equation groups that each includes one or more of the check equations defining the QC-LDPC ECC, and to produce the count updates for the respective equation groups. In other embodiments, the circuitry is configured to produce a first count including a number of differences between values of the variables in the subset and respective values in the received code word, to further produce a second count including the number of differences between values of the variables in the subset, derived in a previous processing instance of the layer, and the respective values in the received code word, and to derive the count updates by subtracting the second count from the first count.

In an embodiment, the circuitry is configured to store the first count, and to produce the second count in a subsequent processing instance of the layer by extracting the stored first count. In another embodiment, the circuitry is configured to store the first count in a register that stores values up to a maximal number that is smaller than a number of the variables in the subset. In yet another embodiment, the circuitry is configured to produce the second count by storing the values of the variables of the subset in the previous processing instance of the layer, and counting the number of differences between the stored values and the respective values of the variables of the code word.

In some embodiments, the circuitry is configured to accumulate the count updates by accumulating a given count update that was produced in processing the respective layer. In other embodiments, the code word is stored in a memory device, and the interface is configured to receive the code word from the memory device. In yet other embodiments, the code word is received in a communication signal, and the interface is configured to receive the code word received in the communication signal.

There is additionally provided, in accordance with an embodiment a method for decoding including, receiving in a decoder a code word that was encoded using a Quasi-Cyclic Low Density Parity Check (QC-LDPC) Error Correcting Code (ECC) represented by multiple check equations that are defined over multiple variables. The code word is decoded by iteratively processing multiple layers that each includes a respective subset of the variables of the code word, and producing, per each layer, one or more count updates. A total number of errors corrected over the entire code word is generated by accumulating the count updates.

These and other embodiments will be more fully understood from the following detailed description of the embodiments thereof, taken together with the drawings in which:

DETAILED DESCRIPTION OF EMBODIMENTS

Overview

Figure 1:
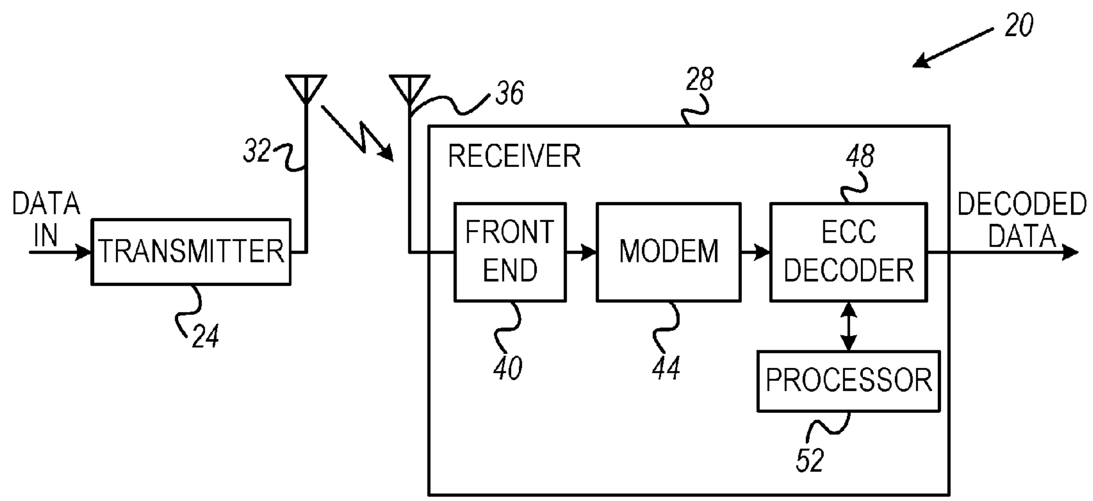
FIG. 1 is a block diagram that schematically illustrates a communication system that uses Error Correction Coding (ECC), in accordance with an embodiment that is described herein.

Various systems protect data using error correction coding (ECC). Data protection using ECC is used, for example, in communication systems and in data storage systems. Data that is encoded in accordance with a given ECC comprises a valid code word of the ECC. A code word introduced to a decoder as input may be corrupted. Some types of decoders attempt to decode the code word by iteratively processing the input.

Embodiments that are disclosed herein provide improved methods and systems for evaluating the number of errors corrected in iterative ECC decoding. The evaluated number of errors corrected can be used for various purposes. For example, in communication systems, the number of errors corrected over multiple decoding operations can be used for measuring the quality of the communication channel, and may be used for adapting the transmitter, receiver or both, accordingly. As another example, in systems that store encoded data in Flash memories, the number of errors corrected in decoding retrieved data that was previously encoded and stored, can be used for adjusting read thresholds in the Flash memories so as to improve the reading quality. The number of errors corrected in an entire code word (CW) is also referred to herein as a "total error count" or "CW error count."

In principle, an ECC decoder can first converge to a valid code word, and then calculate the number of errors over the entire code word. Such a decoder would typically compare between the entire decoded code word and the decoder input and count the number of differences. In many applications, however, the code word may contain several thousand bits, and counting the differences over such a long code word may introduce an unacceptable latency. For example, in typical applications in which convergence to a valid code word requires about five or six decoding iterations, the latency introduced by counting the number of errors corrected may be on the order of the decoding iteration period.

In the disclosed embodiments, the decoder spreads the error count evaluation task over the decoding iterations and over multiple subsets of the code word. Each of the calculations is carried out within a single clock cycle and therefore introduces no processing latency. Calculating the total error count is carried out incrementally during the iterative decoding without waiting for the decoding to converge. As a result, little or no latency is introduced following the convergence to a valid code word.

In some embodiments, the disclosed technique is implemented in an iterative decoder of an LDPC code, e.g., a QC-LDPC code. LDPC codes can be represented by multiple check equations that are defined over multiple variables. An iterative decoder for such codes may be represented using multiple check nodes corresponding to the check equations, and multiple variable nodes corresponding to the variables. In this representation, a variable node corresponding to a given variable is connected to the check nodes corresponding to the check equations in which the variable appears. A decoder of this sort, i.e., a message passing decoder, decodes the ECC by exchanging messages between check nodes and variable nodes that are connected to one another, in an attempt to converge to a valid code word that satisfies all the check equations representing the ECC.

In some iterative decoding schemes, the decoder processes the variables (or variable nodes) in groups that are referred to as layers. Consider a QC-LDPC ECC, in which each layer comprises L variables. The L variables in a given layer are associated with one or more equation groups that each comprises L check equations, in accordance with the structure of the ECC.

The decoder initializes the variable nodes to the values of the input to be decoded, which is also referred to as the "channel output." The decoder then processes the layers by updating the layer variables based on messages received from the check nodes of respective equation groups and on the values of the channel output corresponding to the variables of the layer.

Processing the layer variables with respect to some equation group is referred to herein as a "processing instance." In other words, a processing instance refers to processing the subset of variables and the group of check equations that are associated with a respective circulant sub-matrix of the parity-check-matrix representing the QC-LDPC code. In each processing instance the decoder produces a count update that is indicative of the number of differences between the updated variables and channel output corresponding to the respective variable layer. The decoder counts the total number of errors corrected over the entire code word by accumulating the count updates over the layers and equation groups.

In some embodiments, in each processing instance, the decoder calculates a partial count as the number of differences between the variables updated in this processing instance and the values of the channel output corresponding to these variables. The decoder produces count updates by calculating differences between consecutive partial counts. The decoder stores the partial count in a register and uses the stored partial count for calculating the count update in the next processing instance that is related to the layer variables.

In some embodiments, the partial counts corresponding to two or more variable layers that are processed consecutively are handled to produce a common partial count that is stored in a single merged register that is smaller than the storage space required for storing the partial counts in separate respective registers.

In some embodiments, the accuracy of the evaluated total error count can be tolerated. In such embodiments, the partial count (or a saturated value thereof) is stored in a register that is capable of storing values up to a maximal number smaller than the number of variables in the layer.

In other embodiments, instead of storing the partial counts, the decoder stores the updated variables. In these embodiments, in each processing instance the decoder calculates a first partial count based on the updated variables and the corresponding values of the channel output, and further calculates a second partial count based on the stored variables and the corresponding values of the channel output. The decoder produces the count update by calculating the difference between the first and second partial counts.

System Description

FIG. 1 is a block diagram that schematically illustrates a wireless communication system 20 that uses error correction coding, in accordance with an embodiment that is described herein. System 20 comprises a transmitter 24, which transmits data to a receiver 28. The transmitter accepts input data, encodes the data with a certain ECC (the encoded data is also referred to as a code word), modulates the encoded data in accordance with a certain modulation scheme, converts the modulated digital signal to an analog signal, up-converts the analog signal to a suitable Radio frequency (RF), and transmits the RF signal toward the receiver using a transmitting antenna 32.

In receiver 28, a receiving antenna 36 receives the RF signal and provides it to a RF front end 40. The front end down-converts the RF signal to baseband or to a suitable Intermediate Frequency (IF), and digitizes the signal with a suitable Analog to Digital Converter (ADC—not shown in the figure). The digitized signal carrying the ECC-encoded data (i.e., the code word sent by the transmitter) is demodulated by a modem 44, and the ECC is decoded by an ECC decoder 48. Decoder 48 is controlled by a processor 52. The structure and functionality of decoder 48 are described in detail below. By decoding the ECC, decoder 48 reconstructs the data that was input to transmitter 24. The reconstructed data is provided as the receiver output.

System 20 may comprise, for example, a cellular system, a satellite system, a point-to-point communication link, or any other suitable communication system that employs ECC. Although the example of FIG. 1 refers to a wireless communication system, the techniques described herein can be used with wire-line communication systems, such as cable communication systems, as well. The disclosed techniques can also be used in communication systems that combine wireless and wire-line communication.

Figure 2:
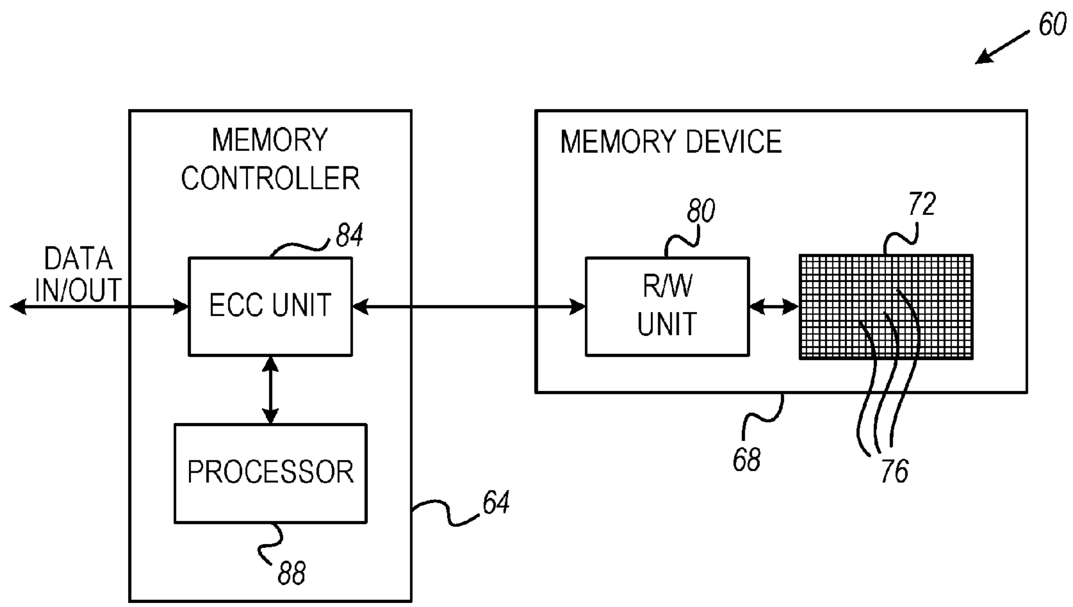
FIG. 2 is a block diagram that schematically illustrates a memory system that uses Error Correction Coding (ECC), in accordance with an embodiment that is described herein.

FIG. 2 is a block diagram that schematically illustrates a data storage system 60 that uses error correction coding, in accordance with an alternative embodiment that is described herein. System 60 comprises a memory controller 64, which stores data in a memory device 68. The memory device comprises an array 72 comprising multiple memory cells 76. Array 72 may comprise any suitable type of volatile or non-volatile memory, such as, for example, Random Access Memory (RAM) or Flash memory. Alternatively, device 68 may comprise a magnetic storage device such as a Hard Disk Drive (HDD), or any other suitable storage medium. System 60 can be used in various host systems and devices, such as in computing devices, cellular phones or other communication terminals, removable memory modules, Solid State Disks (SSD), digital cameras, music and other media players and/or any other system or device in which data is stored and retrieved.

Memory device 68 comprises a Read/Write (R/W) unit 80, which writes data values into memory cells 76 and reads data values from the memory cells. Memory controller 64 comprises an ECC unit 84, which encodes the data for storage with a certain ECC, and decodes the ECC of data that is retrieved from the memory cells. Unit 84 is controlled by a processor 88. The structure and functionality of mainly the decoding part of unit 84 are described in detail below. The ECC used in systems 20 and 60 may comprise, for example, a Low Density Parity Check (LDPC) code such as a Quasi-Cyclic (QC) LDPC code, as well as various other types of ECC.

The ECC decoding schemes described herein can be used in communication systems such as system 20, as well as in data storage systems such as system 60. The description that follows applies to both communication applications and to storage applications, and refers generally to an ECC decoder. Any reference to the ECC decoder applies to decoder 48 of system 20, as well as to the decoder functionality of unit 84 in system 60. Alternatively, the methods described herein can be carried out by any other suitable element in any other suitable system that involves ECC decoding.

QC-LDPC Codes and Decoder Structure

In some embodiments, ECC decoder 48 of system 20, and/or the decoding part of ECC unit 84 of system 60 comprises a Quasi-Cyclic (QC) LDPC decoder. A QC-LDPC ECC may be represented by a parity-check-matrix that comprises multiple sub-matrices, or sub-blocks, each comprising a zero matrix or a circulant matrix. Circulant matrices are characterized by the property that each row in the matrix is derived by shifting its preceding row cyclically one position.

In the description that follows we focus mainly on circulant sub-matrices that are based on an L-by-L identity matrix I. Thus, a non-zero sub-matrix comprises the matrix I or a version of I whose rows are cyclically shifted a number of positions between 1 and L−1.

An LDPC code (and QC-LDPC codes in particular) that is defined by a given parity-check-matrix can be equivalently represented by a set of multiple check equations that are defined over multiple variables. A given variable participates in a given check equation if the corresponding entry in the parity-check-matrix is non-zero.

Figure 3:
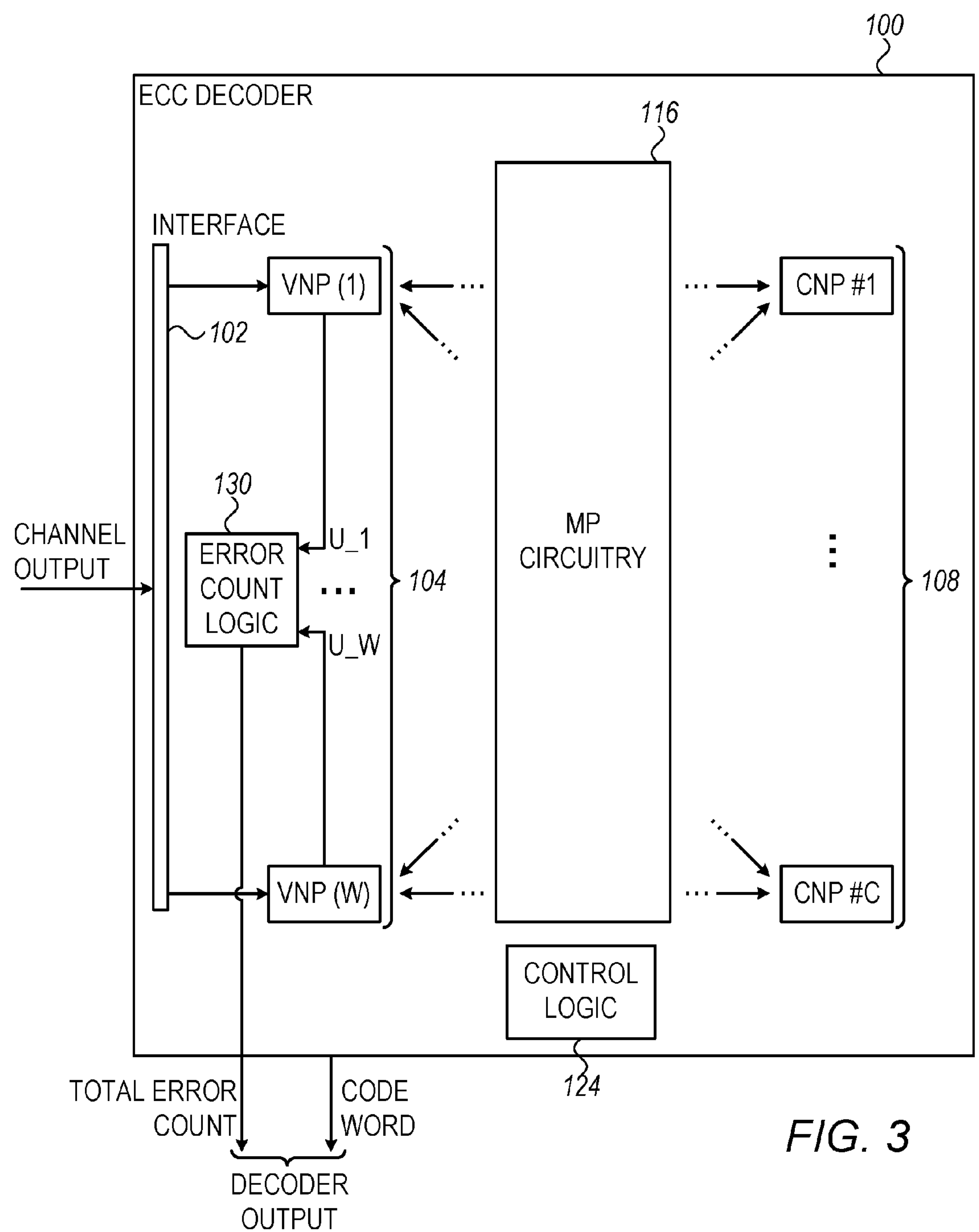
FIG. 3 is a block diagram that schematically illustrates an ECC decoder, in accordance with an embodiment that is described herein.

FIG. 3 is a block diagram that schematically illustrates an ECC decoder 100, in accordance with an embodiment that is described herein. Decoder 100 can be used to implement decoder 48 of FIG. 1 above, or ECC unit 84 of FIG. 2 above. Decoder 100 accepts input data to be decoded via an interface 102. The input to decoder 100 may comprise valid ECC code words, or other input that comprises corrupted code words (e.g., by noise) and therefore contain errors. In other words, the input to the decoder may not always comprise valid code words of the ECC. In the description that follows, the input to the decoder is also referred to as the channel output. The ECC decoder decodes the input while attempting to correct these errors, so as to reconstruct the data conveyed in the code words. In a typical implementation, each code word comprises on the order of several hundred to several thousand bits, although any other suitable code word size can be used.

The QC-LDPC ECC in question is defined by a set of M check equations, which are defined over a set of V variables (e.g., bits for a binary LDPC code). As described above, the ECC is equivalently represented by an M-by-V parity-check-matrix whose rows and columns correspond to the check equations and variables, respectively. For the purpose of processing, the variables and check equations are associated with respective variable nodes and check nodes. Decoder 100 comprises a set of W Variable Node Processors (VNPs) 104 denoted VNP(1) . . . VNP(W), and a set of C Check Node Processors (CNPs) 108 denoted CNP#1 . . . CNP#C. Each variable node may be associated with a respective VNP, and each check equation may be associated with a respective CNP.

VNPs 104 and CNPs 108 are connected via a Message-Passing (MP) circuitry unit 116 and communicate with one another over edges (shown as arrows in the figure) in accordance with the structure of the code. The VNP assigned to each variable (or variable node) is connected to the CNPs that are assigned to the check equations (or check node) in which that variable appears. As long as the decoder has not yet converged to a valid code word, at least one check equation is still unsatisfied, and the decoding process typically continues.

The description that follows refers mainly to binary LDPC and QC-LDPC codes, in which case the values assigned to the code variables are also referred as bit values, and the variable nodes are also referred to as bit nodes. The disclosed techniques, however, are similarly applicable to non-binary codes, as well.

In some embodiments, decoder 100 carries out an iterative Message-Passing (MP) decoding scheme. In an example MP scheme, VNPs 104 are initialized with the respective bit values of the channel output. The VNPs and CNPs exchange messages with one another over the edges that connect them. Based on the messages received from the CNPs and on the channel output, VNPs may adapt their bit values. The operation of adapting the bit values is also referred to herein as a "decision making" operation. This scheme is sometimes referred to as Belief Propagation (BP), and the messages exchanged between the VNPs and CNPs are sometimes referred to as BP messages. The messages from the CNPs to the VNPs are referred to herein as CNP messages, and the messages from the VNPs to the CNPs are referred to herein as VNP messages.

In example disclosed embodiments, decoder 100 comprises a QC-LDPC decoder, which is configured to decode a respective QC-LDPC ECC, whose parity-check-matrix comprises L-by-L circulant sub-matrices.

In some embodiments, decoder 100 processes L check nodes and/or variable nodes in parallel, and delivers L CNP or VNP messages simultaneously. In the description that follows the term "simultaneous" refers to operations that occur during a single clock period.

Decoder 100 comprises control logic 124 that manages and coordinates the operations carried out by the various elements of decoder 100. For example, control logic 124 schedules the operation of VNPs 104 and CNPs 108.

In the description that follows, control logic 124 of decoder 100 manages the scheduling or scanning order of the variable and check nodes. In the present example, an outer loop scans the variable nodes and an inner loop scans the check nodes connected to each scanned variable node. This scheduling order is sometimes referred to as "serial V" or "column-layered". In alternative embodiments, the outer loop scans the check nodes and the inner loop scans the variable nodes for the currently-scanned check node. The latter scheduling order is sometimes referred to as "serial C" or row-layered. Hybrid scheduling orders are also feasible.

In some embodiments, the variables of the entire code word are partitioned into subsets that are referred to as variable layers, or simply layers for brevity. The variables within a given variable layer may be processed in any suitable order. In some embodiments, the layer variables are processed simultaneously.

Consider a QC-LDPC code, which is defined by M check equations that are defined over V variables, and is represented by a respective M-by-V parity-check-matrix H that comprises L-by-L sub-matrices. The parity-check-matrix H can be partitioned into V/L block-columns that each comprises M/L sub-matrices. Each block-column has at least one non-zero sub-matrix. Since the non-zero sub-matrices comprise shifted versions of the identity matrix, each such sub-matrix defines connections between L variables and respective L check equations.

In the example of FIG. 3, the V variables are partitioned into W=V/L layers corresponding to respective W block-columns of H. Decoder 100 assigns a dedicated VNP to the L variables of each respective layer. The L layer variables are associated with one or more equation groups that each comprises L check equations in accordance with the structure of the ECC.

The VNP assigned to a given layer (or column-block), processes the L layer variables with respect to each of the respective equation groups. For a given equation group, this processing involves updating the L variables based on the channel output and on CNP messages most recently received by the VNP that are related to the check equations of the given equation group. According to this scheme, updating the layer variables is carried out for each non-zero sub-matrix in the respective block-column of H. The processing of the layer variables with respect to one equation group is also referred to herein as a "processing instance."

As described above, the variable nodes are initialized to the bit values of the channel output, and the decoder iteratively updates the variable nodes in an attempt to converge to a valid code word. After convergence, the number of differences between the bit values of the variable nodes and the respective bit values of the channel output equals the number of errors corrected in decoding the code word. As will be described in detail below, in the disclosed embodiments, the number of errors corrected over the entire code word is calculated by calculating count updates per the processing instances, and accumulating these count updates.

Each VNP 104 produces a count indication that is indicative of the number of differences between the updated variables and channel output corresponding to the respective variable layer. When the decoder converges to a valid code word a VNP count indicates the number of errors corrected in the variables of the code word corresponding to the respective variable layer. In FIG. 3 the count indications are denoted U_1 . . . U_W for the respective layers 1 . . . W. In the present example, the VNP re-calculates the count indications in response to updating the layer variables in each processing instance. Decoder 100 comprises error count logic 130 that generates the total error count based on the count indications. At convergence, the decoder typically outputs the decoded code word as well as the total error count. Example embodiments for calculating the count indications by VNPs 104 and for generating the total error count by error count unit 130 are described further below.

The configuration of decoder 100 shown in FIG. 3 is an example configuration that is depicted purely for the sake of conceptual clarity. In alternative embodiments, decoder 100 can be implemented using any other suitable configuration.

In the context of the present patent application and in the claims, the various decoder elements excluding interface 102 are collectively referred to as "circuitry." In the example of FIG. 3, the circuitry comprises VNPs 104, CNPs 108, MP circuitry 116, control logic 124 and error count unit 130. In alternative embodiments, the circuitry can be implemented in any other suitable manner, not necessarily using VNPs and CNPs.

ECC decoder 48 of FIG. 1, ECC unit 84 of FIG. 2 and the decoder 100 of FIG. 3 may be implemented in software, in hardware, or using a combination of hardware and software elements. In some embodiments, decoder 48, unit 84 and/or decoder 100 comprises a general-purpose processor, which is programmed in software to carry out the functions described herein. The software may be downloaded to the processor in electronic form, over a network, for example, or it may, alternatively or additionally, be provided and/or stored on non-transitory tangible media, such as magnetic, optical, or electronic memory.

In some embodiments, decoder 48, unit 84 and/or decoder 100 (including interface 102, VNPs 104, CNPs 108, MP circuitry 116, control logic 124 and error count unit 130) are implemented in hardware, such as using one or more Application-Specific Integrated Circuits (ASICs), Field-Programmable gate Arrays (FPGAs) and/or discrete components. Some or all of the decoder functions may alternatively be implemented in software, or using a combination of software and hardware elements.

Embodiments for Evaluating the Total Error Count

Figure 4:
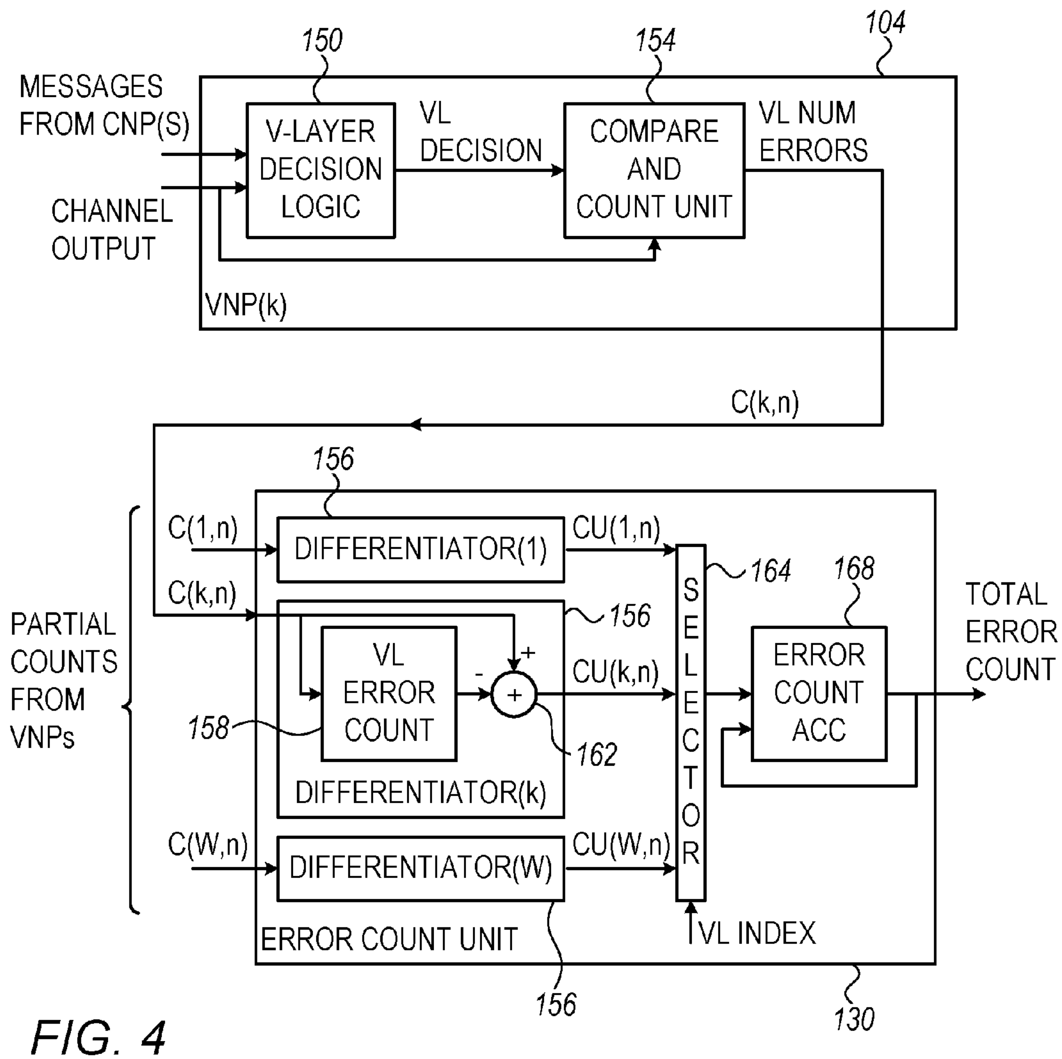
FIGS. 4 and 5 are block diagrams that schematically illustrate the details of one of the variable node processors (VNP) and of the error count unit depicted in FIG. 1, in accordance with embodiments that are described herein.
Figure 5:
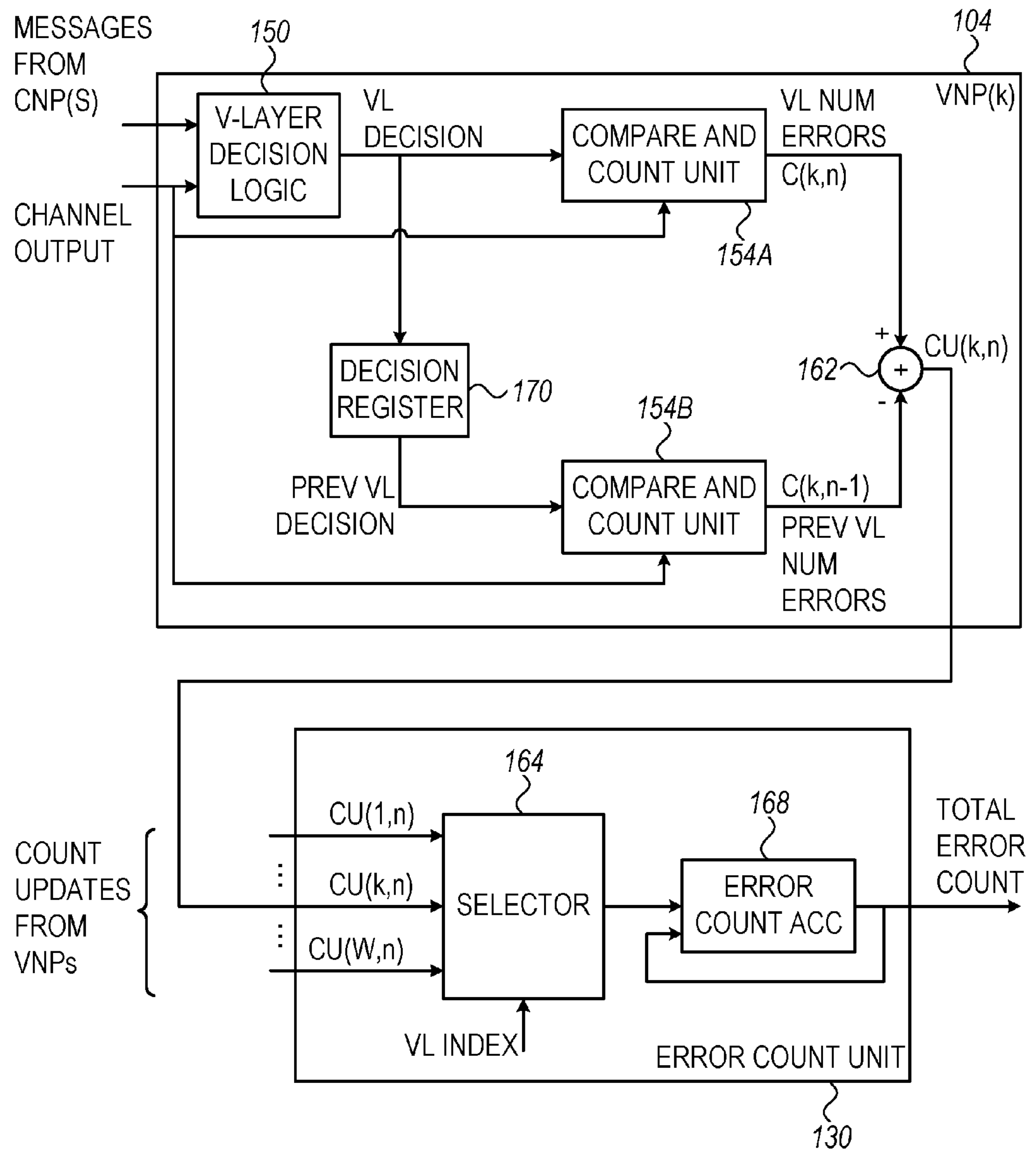

FIGS. 4 and 5 are block diagrams that schematically illustrate the details of one of variable node processors (VNP) 104 and of error count unit 130 depicted in FIG. 1, in accordance with embodiments that are described herein.

In the embodiment of FIG. 4, VNP 104 comprises decision logic 150 and a compare and count unit 154. In processing the variable layers by the VNP, decision logic 150 updates the layer variables based on the most recent CNP messages received in the VNP and on the channel output, as described above. In some embodiments, the CNP messages are sent from a CNP that process a group of L check nodes in accordance with the structure of the ECC.

Unit 154 compares between the bit values of the updated variables and respective bit values of the channel output, and counts the number of differences in the range 0 . . . L. In an embodiment, unit 154 counts the number of differences within a single clock cycle. In FIG. 4, the output of unit 154 is denoted C(1,n), wherein '1' is the layer index, and 'n' indicates the number of processing instances applied to the layer variables.

Error count unit 130 comprises W differentiators 156 that each comprises an error count register 158 and a subtraction unit 162. In FIG. 4, for the sake of clarity, only the $k^{th}$ differentiator is shown in detail. Each differentiator receives as input partial counts calculated by one of the VNPs, and calculates differences between consecutive partial counts.

Error count register 158 is initialized to zero, i.e., C(k,0)=0, and for n>0 the register stores previously received partial counts C(k,n−1). Subtraction unit 162 calculates the differences CU(k,n) as:

$$CU(k,n)=C(k,n)-C(k,n-1) \quad \text{Equation 1:}$$

The outputs of differentiators 156 are also referred to herein as "count updates." The other differentiators receive partial counts from their respective VNPs and function similarly to the $k^{th}$ differentiator described above.

A selector 164 accepts the outputs of differentiators 156 and selects one of these inputs in accordance with the layer index. For example, when VNP(k) processes the $k^{th}$ layer and produces a partial count C(k,n), the selector selects the count update CU(k,n) of the $k^{th}$ differentiator as the selector output. In alternative embodiments, calculating CU(k,n) for k=1 . . . W is carried out at the selector output using a single subtraction unit similar to unit 162, which replaces the W subtraction units 162 of differentiators 156.

An error count accumulator receives the count updates selected by selector 164. Accumulator 168 is initialized to zero and accumulates the count updates as they arrive. Note that summing T consecutive count updates CU(k,n) results in:

$$\sum_{n=1}^{T} CU(k, n) = C[k, T(k)] \quad \text{Equation 2}$$

In Equation 2, C[k,T(k)] equals the number of differences between the channel output corresponding to the respective L variables of the code word after applying T(k) processing instances to the $k^{th}$ layer. As a result of accumulating C[k,T(k)] over the layers k=1 . . . W, when the decoder converges, the output of accumulator 168 holds the number of errors corrected over the entire code word.

In FIG. 5, VNP 104 comprises decision logic 150 and compare and count unit 154A. Similarly to the VNP in FIG. 4, unit 154A outputs a sequence C(k,n), wherein k denotes the layer index, and n denotes the $n^{th}$ processing instance. The VNP in FIG. 5 further comprises a decision register 170 that stores L bit values of the variables as updated in the previous processing instance. The VNP comprises an additional compare and count unit 154B that compares between the bit values in decision register 170 and corresponding bit values of the channel output. The output of unit 154B equals C(k,n−1). Subtraction unit 162 calculates the count update CU(k,n) as given in Equation 1 above.

Note that although CU(k,n) is calculated differently in FIGS. 4 and 5, given the same channel output to decoder 100, the $k^{th}$ differentiator in FIG. 4 and subtraction unit 162 in FIG. 5 produce the same count update sequence CU(k,n). This equivalence holds for all the layers k=1 . . . W.

Error count unit 130 in the embodiment of FIG. 5 comprises selector 164 and error count accumulator 168 similarly to error count unit 130 of FIG. 4. Since the selectors in both embodiments accept the same inputs CU(1,n) . . . CU(W,n), error count unit 130 in FIG. 5 generates the same output as error count unit 130 of FIG. 4, i.e., generates the total error count over the entire code word.

Similarly to the description of FIG. 4, in some embodiments, a single subtraction unit 162 calculates C(k,n)−C(k, n−1) at the output of selector 164 instead of within each VNP 104. In such embodiments each VNP delivers to the selector both C(k,n) and C(k,n−1).

In FIGS. 4 and 5, the processing instance 'n' is common to all the layers. This choice is done only for the sake of clarity. In practice, different layers may undergo different numbers of processing instances at any given point of the iterative decoding.

The embodiments described in FIGS. 4 and 5 are given by way of example, and other suitable embodiments can also be used. For example, error count register 158 stores values in the range 0 . . . L and therefore comprises $1+\log_2(L)$ bits of storage. Storing the previous partial counts within all the differentiators requires $W\cdot[1+\log_2(L)]$ bits. For example, for a QC-LDPC code in which L=128 and the variables are partitioned into W=200 layers, this embodiments requires $200\cdot[1+\log_2(128)]=1600$ bits for storing the partial counts. Although in some applications such storage space is acceptable, in alternative embodiments the storage requirement can be reduced as described herein.

In one embodiment, a single error count register stores the partial counts of two layers. For example, differentiators 156 that receive partial counts C(k,n) and C(k+1,n) can be merged to accept a combined input [C(k,n)+C(k+1,n)] and store previous partial counts [C(k,n−1)+C(k+1,n−1)]. In this embodiment, the storage requirement is given by $(W/2)\cdot[2+\log_2(L)]$ bits. In the above example this results in 900 bits, which is significantly smaller than the 1600 bits required in the embodiment of FIG. 4.

Typically, the number of differences between the values of the layer variables and those of the channel output is much smaller than L. For example, the probability of having all the L variables flipped in a single layer is very small, and therefore the partial counts are stored in registers that each comprises $\log_2(L)$ bits instead of $1+\log_2(L)$ bits. In this embodiment the overall storage requirement reduces by W bits, with a negligible probability of evaluating an incorrect total error count.

In some systems, an application that receives the decoder outputs allows a certain level of inaccuracy in the total error count. In some embodiments, the partial counts are stored in registers having less than $1+\log_2(L)$ bits. For example, for L=128, registers 158 may comprise 5 bits instead of 8 bits. In such embodiments a register having B<L bits can store partial counts in the range 0 . . . $2^B-1$. When the partial count exceeds $2^B-1$, the register stores the saturated value $2^B-1$. By selecting sufficiently large register size B, the probability of producing an inaccurate total error count and the level of inaccuracy can be controlled.

Although the disclosed embodiments mainly refer to QC-LDPC codes, the embodiments can be adapted to be applicable to other suitable types of iterative decoders, such as LDPC decoders.

It will be appreciated that the embodiments described above are cited by way of example, and that the following claims are not limited to what has been particularly shown and described hereinabove. Rather, the scope includes both combinations and sub-combinations of the various features described hereinabove, as well as variations and modifications thereof which would occur to persons skilled in the art upon reading the foregoing description and which are not disclosed in the prior art. Documents incorporated by reference in the present patent application are to be considered an integral part of the application except that to the extent any terms are defined in these incorporated documents in a manner that conflicts with the definitions made explicitly or implicitly in the present specification, only the definitions in the present specification should be considered.

The invention claimed is:

1. A storage system, comprising:

a memory, configured to store a code word that was encoded using a Quasi-Cyclic (QC) Low Density Parity Check (QC-LDPC) Error Correcting Code (ECC) represented by multiple check equations that are defined over multiple variables; and a hardware-implemented decoder, configured to:

receive the code word that was read from the memory, wherein the code word contains one or more errors caused by impairments in the memory;

decode the code word by iteratively processing multiple layers that each comprises a respective subset of the variables of the code word, and producing, per each layer, one or more count updates;

generate a total number of errors corrected over the entire code word by accumulating the count updates; and output at least one of the decoded code word and the total number of errors corrected.

2. The storage system according to claim 1, wherein the decoder is configured to process each of the layers by processing the variables of the layer with respect to one or more equation groups that each comprises one or more of the check equations defining the QC-LDPC ECC, and to produce the count updates for the respective equation groups.

3. The storage system according to claim 1, wherein the decoder is configured to:

produce a first count comprising a number of differences between values of the variables in the subset and respective values in the received code word;

produce a second count comprising the number of differences between values of the variables in the subset, derived in a previous processing instance of the layer, and the respective values in the received code word; and derive the count updates by subtracting the second count from the first count.

4. The storage system according to claim 3, wherein the decoder is configured to:

store the first count; and produce the second count in a subsequent processing instance of the layer by extracting the stored first count.

5. The storage system according to claim 4, wherein the decoder is configured to store the first count in a register that stores values up to a maximal number that is smaller than a number of the variables in the subset.

6. The storage system according to claim 3, wherein the decoder is configured to produce the second count by storing the values of the variables of the subset in the previous processing instance of the layer, and counting the number of differences between the stored values and the respective values of the variables of the code word.

7. The storage system according to claim 1, wherein the decoder is configured to accumulate the count updates by accumulating a given count update that was produced in processing the respective layer.

8. A method for data storage, comprising:

in a storage system comprising a memory and a hardware-implemented decoder coupled to the memory, reading from the memory a code word that was encoded using a Quasi-Cyclic Low Density Parity Check (QC-LDPC) Error Correcting Code (ECC) represented by multiple check equations that are defined over multiple variables, wherein the code word contains one or more errors caused by impairments in the memory;

decoding the code word, by the decoder, by iteratively processing multiple layers that each comprises a respective subset of the variables of the code word, and producing, per each layer, one or more count updates;

generating a total number of errors corrected over the entire code word by accumulating the count updates; and outputting, by the decoder, at least one of the decoded code word and the total number of errors corrected.

9. The method according to claim 8, wherein processing the multiple layers comprises processing the variables of each of the layers with respect to one or more equation groups that each comprises one or more of the check equations defining the QC-LDPC ECC, and wherein producing the count updates comprises producing the count updates for the respective equation groups.

10. The method according to claim 8, wherein producing the count updates comprises producing a first count comprising a number of differences between values of the variables in the subset and respective values in the received code word, further producing a second count comprising the number of differences between values of the variables in the subset, derived in a previous processing instance of the layer, and the respective values in the received code word, and deriving the count updates by subtracting the second count from the first count.

11. The method according to claim 10, wherein producing the count updates comprises storing the first count, and producing the second count in a subsequent processing instance of the layer by extracting the stored first count.

12. The method according to claim 11, wherein storing the first count comprises storing the first count in a register that stores values up to a maximal number that is smaller than a number of the variables in the subset.

13. The method according to claim 10, wherein producing the count updates comprises producing the second count by storing the values of the variables of the subset in the previous processing instance of the layer, and counting the number of differences between the stored values and the respective values of the variables of the code word.

14. The method according to claim 8, wherein accumulating the count updates comprises accumulating a given count update that was produced in processing the respective layer.

15. A receiver in a communication system, the receiver comprising:

an interface, configured to receive a code word that was encoded, in a transmitter of the communication system, using a Quasi-Cyclic (QC) Low Density Parity Check (QC-LDPC) Error Correcting Code (ECC) represented by multiple check equations that are defined over multiple variables, wherein the code word contains one or more errors caused by a communication channel between the transmitter and the receiver; and a hardware-implemented decoder, configured to:

decode the received code word by iteratively processing multiple layers that each comprises a respective subset of the variables of the code word, and producing, per each layer, one or more count updates;

generate a total number of errors corrected over the entire code word by accumulating the count updates; and output at least one of the decoded code word and the total number of errors corrected.

16. A method for communication, comprising:

in a receiver of a communication system, receiving a code word that was encoded in a transmitter of the communication system, using a Quasi-Cyclic (QC) Low Density Parity Check (QC-LDPC) Error Correcting Code (ECC) represented by multiple check equations that are defined over multiple variables, wherein the code word contains one or more errors caused by a communication channel between the transmitter and the receiver;

decoding the received code word, by a hardware-implemented decoder of the receiver, by iteratively processing multiple layers that each comprises a respective subset of the variables of the code word, and producing, per each layer, one or more count updates;

generating a total number of errors corrected over the entire code word by accumulating the count updates; and outputting at least one of the decoded code word and the total number of errors corrected.

* * * * *